(12) United States Patent
Noba

(10) Patent No.: US 8,643,049 B2
(45) Date of Patent: Feb. 4, 2014

(54) LIGHT EMITTING DIODE

(75) Inventor: Kohya Noba, Tokyo (JP)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 13/443,492

(22) Filed: Apr. 10, 2012

(65) Prior Publication Data

US 2013/0105838 A1   May 2, 2013

(30) Foreign Application Priority Data

Oct. 27, 2011 (JP) .................................. 2011-236345

(51) Int. Cl.
*H01L 33/60* (2010.01)
(52) U.S. Cl.
USPC ......... 257/98; 257/99; 257/100; 257/E33.072
(58) Field of Classification Search
USPC ................................ 257/98, 99, 100, E33.072
See application file for complete search history.

(56) References Cited

U.S. PATENT DOCUMENTS

2004/0070337 A1*   4/2004   Goh et al. ..................... 313/512

FOREIGN PATENT DOCUMENTS

JP            11-26811            1/1999

* cited by examiner

*Primary Examiner* — Long Pham
(74) *Attorney, Agent, or Firm* — H.C. Park & Associates, PLC

(57) ABSTRACT

A light emitting diode (LED) includes a reflective member, a light transmitting member, and a light emitting component. The light transmitting member is disposed on the reflective member. The light emitting component is disposed on the light transmitting member. The light transmitting member is configured to pass, at the first surface, light propagating from the light emitting component toward the reflective member, and further configured to, at the first surface, totally internally reflect the light reflected from the reflective member.

20 Claims, 4 Drawing Sheets

(a)

(b)

(a)

(b)

LIGHT EMITTING DIODE

CROSS-REFERENCE TO RELATED APPLICATION

This application claims priority from and the benefit of Japanese Patent Application No. 2011-236345, filed on Oct. 27, 2011, which is hereby incorporated by reference for all purposes as if fully set forth herein.

BACKGROUND

1. Field

Exemplary embodiments of the present invention relate to light emitting diodes, and more particularly, to packaged light emitting diodes.

2. Discussion

Light emitting diodes (LEDs) are energy-efficient light emitting apparatuses increasingly being used in various electronic devices, such as in signal lights or backlights of liquid crystal display panels. Conventional LEDs typically include a light emitting component manufactured by sequentially forming an n-type semiconductor layer, an active layer comprising, for example, gallium nitride (GaN), and a p-type semiconductor layer on a supporting substrate. It is noted that the order of the n-type and p-type semiconductor layers may be reversed. In this manner, two electrodes may be respectively disposed on corresponding portions of the n-type and p-type semiconductor layers. Such light emitting components may be disposed within a mounting member and covered with an encapsulant. Accordingly, each of the two electrodes may be connected to an external power source via corresponding wires.

Conventional LEDs configured as described above, typically exhibit light transmitting properties, which cause light to be emitted not only from a top surface of the light emitting component, but also from a bottom surface of the light emitting component. As such, one or more mechanisms may be utilized to reflect light emitted from the bottom surface of the light emitting component to redirect such light for emittance via the top surface of the light emitting component. Such mechanisms can increase the luminance of such conventional LEDs. For example, Japanese Patent Laid-Open Publication No. 11-026811 discloses a mechanism that scatters light emitted from a substrate of a light emitting component by a concavo-convex surface, which is provided on a mounting member having the light emitting component mounted thereon. In this manner, the mechanism enables light to be extracted towards an outside of the light emitting component. Light emitted from the substrate of the light emitting component, however, is scattered by the concavo-convex surface and is made incident upon the substrate of the light emitting component. Therefore, emitted light is not efficiently extracted from the light emitting component. Furthermore, in Japanese Patent Laid-Open Publication No. 11-026811, only one convex portion is disposed on the mounting surface of the mounting member. The light emitting component, however, is mounted on a top portion of the mounting member. Therefore, it is difficult to stably mount the light emitting component on the top portion of the mounting member.

The above information is only provided to enhance understanding of the background of the disclosed exemplary embodiments and, therefore, it may contain information not forming a part of the prior art. Further, the above may contain information beyond that which the prior art may suggest to one of ordinary skill in the art.

SUMMARY

There is a need for an approach that provides more stably configured and efficient, as well as less thermally resistive LEDs.

Various exemplary embodiments of the present invention provide an LED having a structure capable of efficiently extracting light emitted from a substrate of a light emitting component toward an outside of the LED.

Various other exemplary embodiments provide an LED having a structure capable of stably mounting a light emitting component, as well as efficiently extracting light emitted from a substrate of a light emitting component toward an outside of the LED.

Various additional exemplary embodiments provide an LED having a relatively short distance between a light emitting component and a mounting surface of a mounting member upon which the light emitting component is mounted and, thereby, capable of exhibiting low thermal resistance.

Additional embodiments and other features of the disclosed exemplary embodiments will be set forth in the detailed description which follows and, in part, will be apparent to those having ordinary skill in the art upon examination of the following or may be learned from the practice of the disclosed exemplary embodiments. Advantages of the disclosed exemplary embodiments may be realized and obtained as particularly pointed out in the appended claims.

According to one exemplary embodiment, an LED includes: a light emitting component comprising a light emitting layer disposed on a substrate, wherein the light emitting layer is configured to emit light of at least one wavelength, and wherein the substrate is configured to transmit the light therethrough; an adhesive configured to transmit the light therethrough; a light transmitting member configured to transmit the light therethrough; and a reflective member comprising at least one reflection surface configured to reflect the light, wherein the at least one reflection surface is further configured to form an acute angle with an incident surface associated with the light transmitting member, wherein the light emitting component is connected to the light transmitting member via the adhesive, and an index of refraction associated with the light transmitting member is greater than an index of refraction associated with the adhesive.

According to another exemplary embodiment, an LED includes a reflective member; a light transmitting member disposed on the reflective member; and a light emitting component disposed on the light transmitting member, wherein the light transmitting member is configured to pass, at a first surface, light propagating from the light emitting component toward the reflective member, and further configured to, at the first surface, totally internally reflect the light reflected from the reflective member.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate various exemplary embodiments of the invention, and together with the description serve to explain principles of the invention.

DETAILED DESCRIPTION

Figure 1:
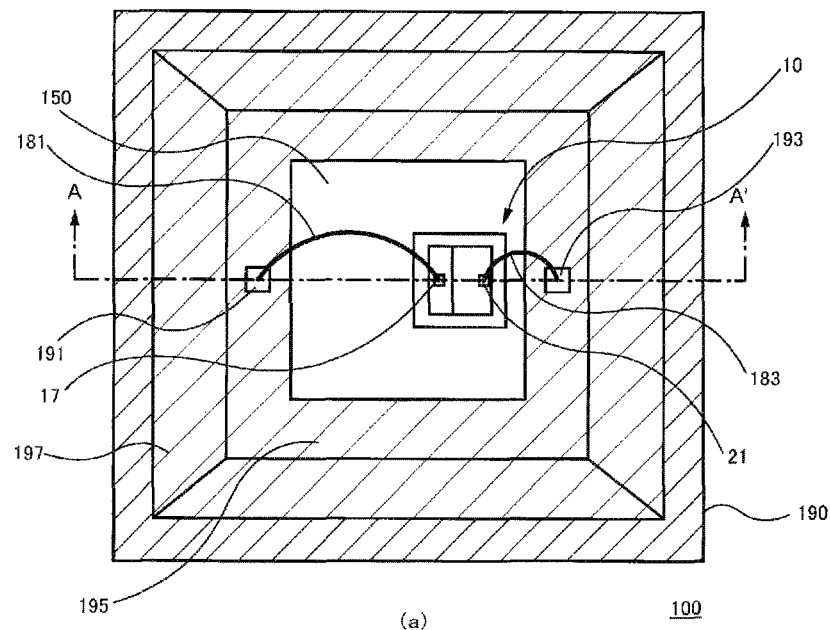
FIG. 1A schematically illustrates a plan view of an LED, according to an exemplary embodiment.
FIG. 1B schematically illustrates a sectional view of the LED of FIG. 1A taken along sectional line A-A', according to an exemplary embodiment.
Figure 1:
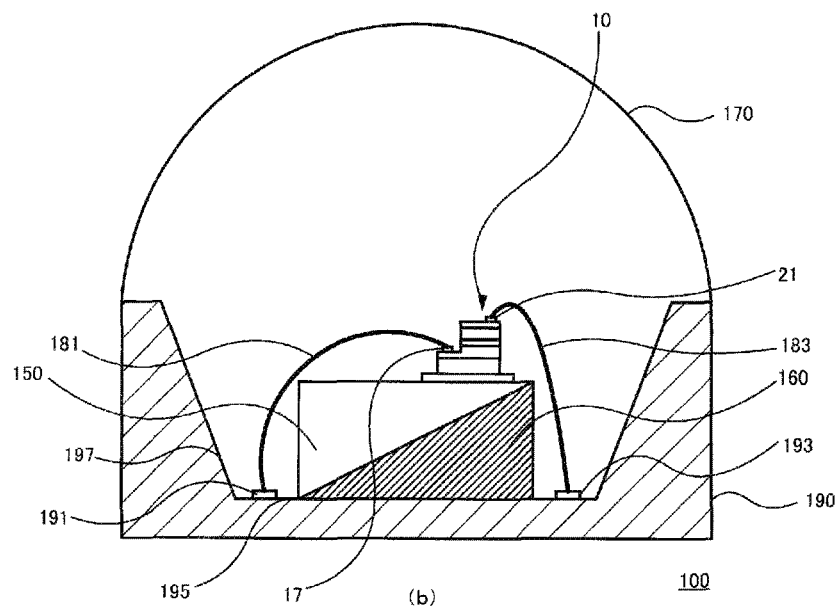

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers and/or regions may be exaggerated for clarity and descriptive purposes. Also, like reference numerals denote like elements.

When an element or layer is referred to as being "on" or "connected to" another element or layer, it may be directly on or directly connected to the other element or layer, or intervening elements or layers may be present. When, however, an element is referred to as being "directly on" or "directly connected to" another element or layer, there are no intervening elements or layers present. For the purposes of this disclosure, "at least one of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by the use of these terms. These terms are only used to distinguish one element, component, region, layer or section from another element, component, region, layer or section. Thus, a first element, component, region, layer or section that is discussed below could be termed a second, third, etc., element, component, region, layer or section without departing from the teachings of the present invention.

Spatially relative terms, such as "beneath", "below", "lower", "above", "upper" and the like, may be used herein for descriptive purposes and, thereby, to describe one element or feature's relationship to another element(s) or feature(s) as illustrated in the drawings. It will be understood that spatially relative terms are intended to encompass different orientations of an apparatus in use and/or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations) and, as such, the spatially relative descriptors used herein are to be interpreted accordingly.

The terminology used herein is for the purpose of describing particular embodiments only and is not intended to be limiting. As used herein, the singular forms "a", "an" and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various exemplary embodiments are described herein with reference to cross-sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this invention is a part. Terms, such as those defined in commonly used dictionaries, should be interpreted as having a meaning that is consistent with their meaning in the context of the relevant art and will not be interpreted in an idealized or overly formal sense unless expressly defined as such herein.

Although various exemplary embodiments are described with respect to LEDs, it is contemplated that various exemplary embodiments are also applicable to other equivalent light emitting technologies, such as organic light emitting diodes (OLEDs), inverted OLEDs (IOLEDs), and the like.

It is observed that conventional LED structures for efficiently extracting light emitted from a substrate of a light emitting component typically focus on ensuring that light emitted from a bottom surface of the light emitting component is sufficiently reflected on a reflection surface and, thereby, redirected for extraction through a top portion of the light emitting component. Light incident on the reflection surface of such conventional LEDs, however, is typically reflected back to the light emitting component and, thereby, absorbed and dissipated as heat. This greatly reduces the luminous efficiency of conventional LEDs. Therefore, the approach according to various exemplary embodiments stems from the recognition that the luminous efficiency of an LED can be improved by ensuring that light incident upon and, thereby, reflected by the reflection surface of an LED is extracted without being incident on and absorbed by the surface of a substrate of a light emitting component. In this manner, light emitted from the substrate of the light emitting component may be efficiently extracted toward the outside of the LED. Hereinafter, various exemplary embodiments will be described with particular emphasis upon mechanisms configured to efficiently extract light emitted from a substrate of a light emitting component of an LED toward an outside of the LED.

FIG. 1A schematically illustrates a plan view of an LED, according to an exemplary embodiment. FIG. 1B schematically illustrates a sectional view of the LED of FIG. 1A taken along sectional line A-A'. FIG. 2 schematically illustrates light propagation behavior of light radiating from a light emitting component of the LED of FIGS. 1A and 1B.

Figure 2:
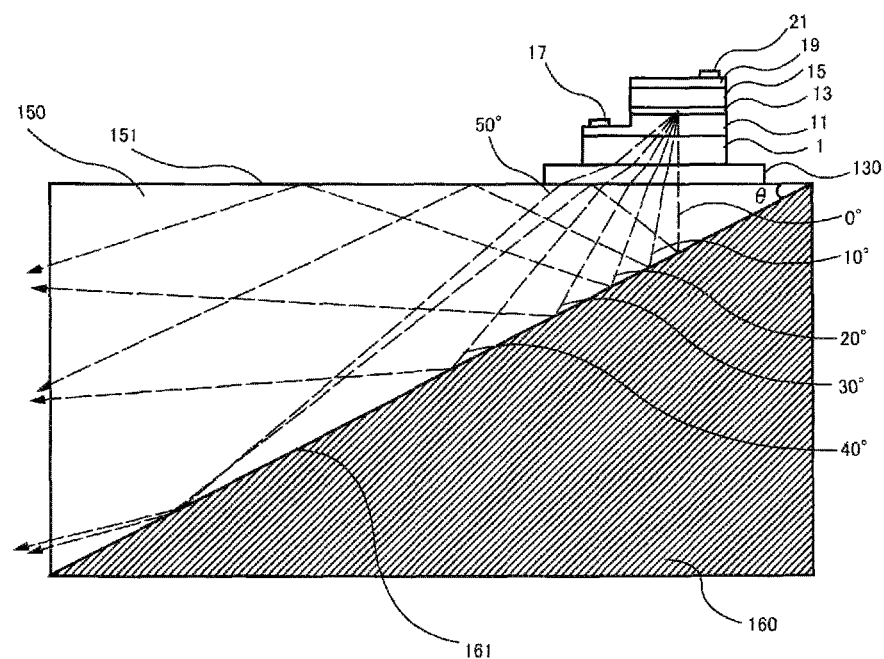
FIG. 2 schematically illustrates light propagation behavior of light radiating from a light emitting component of the LED of FIGS. 1A and 1B, according to an exemplary embodiment.

As seen in FIGS. 1-2, LED 100 includes light emitting component 10 disposed on a mechanism having light transmitting member 150 and reflective member 160 and is, thereby, configured to efficiently extract light toward an outside of LED 100, as well as minimize absorption of reflected light by light emitting component 10. According to various exemplary embodiments, light transmitting member 150 is disposed on reflective member 160, which is disposed on a surface of a concave portion of mounting member 190. Light emitting component 10 is connected to a top surface of light transmitting member 150 via, for example, adhesive 130 or any other suitable intermediate layer. In one embodiment, light emitting component 10 includes first semiconductor layer 11, light emitting layer 13, second semiconductor layer 15, and transparent electrode layer 19, which may be sequentially disposed on a top surface of supporting substrate 1. First electrode layer 17 may be disposed on at least a portion of an exposed region of first semiconductor layer 11. Second electrode layer 21 may be disposed on at least a portion of transparent electrode layer 19. First electrode layer 17 may be electrically connected to third electrode 191 disposed on at least a portion of mounting member 190 via, for instance, bonding wire (or lead) 181. Second electrode layer 21 may be electrically connected to fourth electrode 193 disposed on at least another portion of mounting member 190 via, for example, bonding wire (or lead) 183. According to various exemplary embodiments, encapsulant 170 may encapsulate (or otherwise cover) light emitting component 10, adhesive 130, light transmitting member 150, and reflective member 160. In certain embodiments, encapsulant 170 may further encapsulate at least a portion of mounting member 190, such as a portion including the concave portion of mounting member 190.

Adverting to FIG. 2, light radiating toward substrate 1 and, thereby, being emitted from light emitting component 10 may transmit (or otherwise pass) through adhesive 130 and an upper surface of a top surface of light transmitting member 150. The transmitted light may be incident on reflective member 160 and, thereby, reflected towards a lower surface of the top surface of light transmitting member 150. According to various embodiments, the top surface of light transmitting member 150 may serve as an interface between light transmitting member 150 and adhesive 130, as well as an interface between light transmitting member 150 and encapsulant 170. At least some of the reflected light reflected off of reflective member 160 may be reflected towards at least one other surface of light transmitting member 150, such as a surface (e.g., a side surface) corresponding to an interface between light transmitting member 150 and encapsulant 170. At least some of the reflected light reflected towards the lower surface of the top surface of light transmitting member 150 may be incident upon the lower surface and further reflected by the lower surface. This light may be reflected towards the at least one other surface (e.g., side surface) of light transmitting member 150 and/or made re-incident upon reflective member 160. Re-incident light may be reflected by reflective member 160 towards the at least one other surface (e.g., side surface) of light transmitting member 150. In this manner, light radiating from light emitting component 10 may be directed and/or redirected towards the at least one other surface (e.g., side surface) of light transmitting member 150.

According to various exemplary embodiments, reflection of light at the interface between light transmitting member 150 and adhesive 130 and/or at the interface between light transmitting member 150 and encapsulant 170 corresponding to the lower surface of the top surface of light transmitting member 150, as will be described in more detail, may be effectuated by (or otherwise result from) a refractive index mismatch configured between light transmitting member 150 and adhesive 130 and between light transmitting member 150 and encapsulant 170. In other words, the reflection of light at the lower surface of the top surface of light transmitting member 150 may result from the refractive index associated with light transmitting member 150 being sufficiently greater than the respective refractive indices of adhesive 130 and encapsulant 170.

While light emitting component 10 has been described in association with the aforementioned configuration, it is contemplated that light emitting component 10 may be additionally (or alternatively) configured. For instance, light emitting component 10 may include one or more buffer layers and/or other semiconductor layers disposed between first semiconductor layer 11 and light emitting layer 13. Additionally (or alternatively), one or more buffer layers and/or other semiconductor layers may be disposed between second semiconductor layer 15 and light emitting layer 13. In this manner, any suitable light emitting component may be utilized to radiate light towards light transmitting member 150 and reflective member 160.

According to various exemplary embodiments, first semiconductor layer 11 may correspond to an n-type semiconductor layer and second semiconductor layer 15 may correspond to a p-type semiconductor layer, or vice versa. Transparent electrode layer 19 may comprise, for example, tin oxide ($SnO_2$), indium tin oxide (ITO), and/or any other suitable transparent electrode material, and may be disposed on at least a portion of a top surface of second semiconductor layer 15. In this manner, first and second electrode layers 17 and 21 may be suitably positioned on first and second semiconductor layers 11 and 15, respectively. It is further contemplated that any suitable combination of semiconductor layers may be utilized to form first and second semiconductor layers 11 and 15. Accordingly, the magnitude of power supplied to light emitting component 10 via third and fourth electrodes 191 and 193 disposed on mounting member 190 may be supplied based on and/or in accordance with a configuration of light emitting component 10, e.g., supplied based on and/or in accordance with an arrangement of semiconductor layers forming first and second semiconductor layers 11 and 15.

Supporting substrate 1 may comprise any suitable material, such as, for example, sapphire ($Al_2O_3$), silicon carbide (SiC), zinc oxide (ZnO), silicon (Si), gallium arsenide (GaAs), gallium phosphide (GaP), lithium-alumina ($LiAl_2O_3$), boron nitride (BN), aluminum nitride (AlN), gallium nitride (GaN), and/or the like. First and second semiconductor layers 11 and 15 may also comprise any suitable material, such as, for instance, GaN doped with an n-type impurity to form an n-type semiconductor layer, and AlGaN doped with a p-type impurity to form a p-type semiconductor layer. Light emitting layer 13 may comprise, for example, indium gallium nitride (InGaN, $In_xGa_{1-x}N$) and/or any other suitable material exhibiting a quantum well having a sufficient band gap to enable electrons and holes to be recombined at one or more predetermined rates. It is contemplated that the selection of suitable semiconductor materials, included the material(s) utilized in association with light emitting layer 13, may be adjusted based on one or more wavelengths of light intended to be radiated from light emitting component 10.

First and second electrode layers 17 and 21 may comprise, for example, aluminum (Al), titanium (Ti), nickel (Ni), chrome (Cr), indium (In), tin (Sn), molybdenum (Mo), silver (Ag), gold (Au), niobium (Nb), tantalum (Ta), vanadium (V), platinum (Pt), lead (Pb), beryllium (Be), tin oxide ($SnO_2$), indium oxide ($In_2O_3$), indium tin oxide (ITO), gold-silicon (Au—Si) alloy, gold-germanium (Au—Ge) alloy, gold-zinc (Au—Zn) alloy, gold-beryllium (Au—Be) alloy, and/or the like. First and second electrode layers 17 and 21 may be selectively formed as a p-type or n-type electrode layer based on the configuration of semiconductor layers comprising first and second semiconductor layers 11 and 15, respectively. Although not shown, corresponding pads of first and second electrode layers 17 and 21 may be configured to connect to bonding wires 181 and 183, respectively, and may comprise any suitably formed material, such as, for example, laminated Ti/Au.

According to various exemplary embodiments, light emitting component 10 may radiate light at one or more predetermined wavelengths via light emitting layer 13. In this manner, radiating light may be directed towards supporting substrate 1, second electrode layer 21, and one or more lateral (or side) surfaces of light emitting layer 13. In certain embodiments, half (or substantially half) of the light radiating from light emitting component 10 may be radiated towards supporting substrate 1 and, thereby, made incident on adhesive 130 that is configured to transmit light of one or more predetermined wavelengths.

Adhesive 130, according to exemplary embodiments, is configured to transmit light of one or more predetermined wavelengths that is radiating from light emitting component 10. In this manner, adhesive 130 may comprise any suitable material exhibiting a refractive index less than the index of refraction associated with light transmitting member 150. According to certain embodiments, adhesive 130 may comprise one or more thermosetting resins, e.g., one or more epoxy resins, silicone resins, and/or the like.

Light transmitting member 150, according to exemplary embodiments, is configured to transmit light of one or more predetermined wavelengths. In this manner, light transmitting member 150 may comprise any suitable material exhibiting a refractive index greater than the index of refraction associated with adhesive 130. It is also contemplated that light transmitting member 150 may comprise any suitable material exhibiting a refractive index greater than the index of refraction associated with encapsulant 170. As such, light transmitting member 150 may comprise any suitable material, such as, for example, sapphire ($Al_2O_3$), silicon carbide (SiC), zinc oxide (ZnO), silicon (Si), gallium arsenide (GaAs), gallium phosphide (GaP), lithium-alumina ($LiAl_2O_3$), boron nitride (BN), aluminum nitride (AlN), gallium nitride (GaN), and/or the like. According to various exemplary embodiments, incident surface 151 of light transmitting member 150 is a flat (or substantially flat) surface. In this manner, incident surface 151 enables light emitting component 10 to be stably connected to incident surface 151 and, thereby, connected to light transmitting member 150.

Reflective member 160, according to exemplary embodiments, comprises reflection surface 161 configured to reflect incident light of one or more predetermined wavelengths transmit through light transmitting member 150. According to one embodiment, reflection surface 161 may be inclined with respect to mounting surface 195 of mounting member 190. As such, an angle formed between reflection surface 161 and incident surface 151 of light transmitting member 150 may be an acute angle. Furthermore, and with respect to mounting surface 195, reflection surface 161 may be inclined from one end of reflective member 160 to another end of reflective member 160. Accordingly, angle $\theta$ formed between reflection surface 161 and incident surface 151 may be at least two times greater than a first critical angle $\theta_{c1}$ associated with the respective refractive indices of light transmitting member 150 and adhesive 130. Angle $\theta$ formed between reflection surface 161 and incident surface 151 may also be greater than half a second critical angle $\theta_{c2}$ associated with the respective refractive indices of light transmitting member 150 and encapsulant 170. It is noted that critical angles $\theta_{c1}$ and $\theta_{c2}$ correspond to angles at which incident light is internally reflected rather than refracted.

According to various exemplary embodiments, reflective member 160 may be formed by disposing a metal film comprising, for example, silver, on reflection surface 161, which serves as an interface between reflective member 160 and light transmitting member 150. Reflective member 160 may be sufficiently inclined to enable incident light transmitted through light transmitting member 150 to be totally internally reflected at the lower surface of the top surface of light transmitting member 150, which correspondingly interfaces with adhesive 130 and encapsulant 170. In this manner, light radiating from light emitting component 10 towards supporting substrate 1 can be redirected towards and, thereby, extracted from a side surface of light transmitting member 150.

A mounting area of light emitting component 10 disposed on supporting substrate 1 may be configured smaller than corresponding areas of light transmitting member 150 and reflective member 160. For instance, light emitting component 10 disposed on support substrate 1 may be characterized by a smaller footprint than light transmitting member 150 and reflective member 160. Accordingly, and as previously described, light emitted from light transmitting member 150 may be emitted from at least one side surface of light transmitting member 150 and, as such, light emitting component 10 may not be centrally disposed on a mounting surface of light transmitting member 150. In such instances, light emitting component 10 may be disposed at, near, or around a position corresponding to an interface between incident surface 151 and inclined reflection surface 161 rather than being centrally disposed on the mounting surface of light transmitting member 150. Additionally, respective heights of light transmitting member 150 and reflective member 160 may be determined in association with angle $\theta$ formed between reflection surface 161 and incident surface 151, as well as in association with the length of a side of reflective member 160. It is contemplated, however, that any suitable mounting position for light emitting component 10 may be utilized.

Encapsulant 170, according to various exemplary embodiments, may be configured to allow light of one or more predetermined wavelengths radiating from light emitting component 10 to be transmitted therethrough. As such, encapsulant 170 may be formed comprising any suitable material having a refractive index respectively less than the index of refraction associated with light transmitting member 150. Additionally, one or more materials comprising encapsulant 170 may be selected to define a predetermined index of refraction relationship with adhesive 130. In certain embodiments, encapsulant 170 may comprise one or more thermosetting resins, e.g., epoxy resins, silicone resins, and/or the like. It is contemplated, however, that so long as the index of refraction associated with encapsulant 170 is less than the index of refraction associated with light transmitting member 150, encapsulant 170 may be formed comprising any suitable light transmitting material(s). Furthermore, encapsulant 170 may additionally (or alternatively) comprise one or more additive constituent elements, such as phosphor, or any other suitable material or additive, to enable light associated with a first wavelength radiating from light emitting component 10 to be converted into light associated with at least one other wavelength.

Bonding wires 181 and 183 may comprise any suitable conductive material and may be suitably configured based on design characteristics and/or constraints.

According to various exemplary embodiments, mounting member 190 may be suitably configured to reflect light emitted from at least one side surface of light transmitting member 150 toward a top surface of light emitting component 10, i.e., towards a light emitting direction of LED 100. Mounting member 190 may comprise one or more metal films, such as a thin-film of silver, disposed on mounting surface 195, as well as disposed on reflection surface 197. It is noted that mounting surface 195 may correspond to a surface upon which reflective member 160 may be disposed on a portion thereof. In turn, reflection surface 197 may correspond to one or more surfaces upon which light emitted from light transmitting member 150 may be reflected in the light emitting direction of LED 100. Third and fourth electrodes 191 and 193 may be disposed in any suitable position, such as disposed on mounting member 190 so as to enable bonding wires 181 and 183 to be connected thereto. In this manner, light emitting component 10 may be supplied with power from one or more internal or external power sources.

According to one exemplary embodiment, supporting substrate 1 of light emitting component 10 is formed of, for example, sapphire. As such, supporting substrate 1 may be associated with a refractive index of about 1.77. In this particular exemplary embodiment, adhesive 130 and encapsulant 170 may comprise, for example, a transparent silicone-based adhesive associated with a refractive index of about 1.41. Further, light transmitting member 150 may comprise, for example, sapphire associated with a refractive index of about 1.77, which is relatively greater than the respective indices of refraction associated with adhesive 130 and encapsulant 170.

In this particular illustrative example, angle θ formed between reflection surface 161 and incident surface 151 may be greater than half the critical angle $\theta_c$ associated with the respective refractive indices of light transmitting member 150 and adhesive 130, as well as greater than half the critical angle $\theta_c$ associated with the respective refractive indices of light transmitting member 150 and encapsulant 170. That is, the critical angle $\theta_c$ associated with the refractive index, i.e., 1.77, of light transmitting member 150 and the refractive index, i.e., 1.41, associated with each of adhesive 130 and encapsulant 170 may be determined to be 52.8°. In this manner, angle θ formed between reflection surface 161 and incident surface 151 may be about 27°, which is slightly greater than half the critical angle of 52.8°. Accordingly, if the refractive index of light transmitting member 150 is $n_1$ and the respective refractive indices of adhesive 130 and encapsulant 170 are $n_2$, the critical angle $\theta_c$ may be determined in association with Equation (1).

$$\theta_c = sin^{-1}\left(\frac{n_2}{n_1}\right) \quad \text{Eq. (1)}$$

As seen in FIG. 2, light emitted by light emitting component 10 towards light transmitting member 150 and reflective member 160 passes through supporting substrate 1 and adhesive 130 and is, subsequently, incident upon incident surface 151 of light transmitting member 150. Since the refractive index associated with adhesive 130 is less than that the index of refraction associated with supporting substrate 1, incident light associated with an incident angle less than the critical angle (52.8°) may pass through adhesive 130. It is noted that light incident on adhesive 130 will be refracted before transmission through adhesive 130 at a wider angle (i.e., the light will be refracted away from the normal to the interface between supporting substrate 1 and adhesive 130), wherein the resulting angle of refraction will range from 0° to 90° with respect to the normal. Since the refractive index of light transmitting member 150 is greater than the index of refraction associated with adhesive 130, all (or substantially all) of the light transmitted through adhesive 130 may be incident on light transmitting member 150. In turn, light incident on light transmitting member 150 will propagate to reflection surface 161 where it will be reflected back to light transmitting member 150. Light reflected off reflection surface 161 may have an incident angle ranging from 0° to 52.8° with respect to the normal of incident surface 151, i.e., the interface between light transmitting member 150 and adhesive 130, of light transmitting member 150. Accordingly, light incident on light transmitting member 150 can be controlled to have an incident angle ranging from 0° to 52.8° with respect to the normal of incident surface 151 of light transmitting member 150.

It is further noted that since the angle θ formed between reflection surface 161 and incident surface 151 is about 27°, light incident at 0° with respect to the normal of incident surface 151 may reach reflection member 161 at an incident angle of 27° with respect to the normal of reflection member 161. In this manner, light incident upon reflection member 160 may be reflected on reflection surface 161 and, thereby, redirected toward the lower surface of the top surface of light transmitting member 150, i.e., toward the interface between light transmitting member 150 and adhesive 130 and/or redirected toward the interface between light transmitting member 150 and encapsulant 170. It is also noted that some light incident on reflection member 160 may be reflected and, thereby, redirected toward a side surface of light transmitting member 150 for extraction.

Accordingly, light reflected from reflection surface 161 may be incident on the interface between light transmitting member 150 and adhesive 130 and/or the interface between light transmitting member 150 and encapsulant 170 at an angle of incident of about 54°. Since the incident angle of 54° is greater than the critical angle of 52.8°, light reaching the interface between light transmitting member 150 and adhesive 130 and/or the interface between light transmitting member 150 and encapsulant 170 may be totally internally reflected and, thereby, redirected toward reflection surface 161 and/or toward the side surface of light transmitting member 150 for extraction. As such, light being re-incident on reflection surface 161 may be re-reflected and, thereby, redirected toward the side surface of light transmitting member 150 for extraction. Since the incident angle of light with respect to the side surface of light transmitting member 150 may be about 18°, which is smaller than the critical angle of 52.8°, the light incident on the side surface of light transmitting member 150 may pass through the interface between the side surface of light transmitting member 150 and encapsulant 170 so as to be extracted. Light extracted from light transmitting member 150 may propagate through encapsulant 170 and become incident on mounting member 190. In this manner, light reaching the interface between the side surface of light transmitting member 150 and encapsulant 170 will have an incident angle at which incident light is not totally internally reflected and, thereby, is extracted.

In this illustrative example, light incident at 0° with respect to the normal of incident surface 151 of light transmitting member 150 may be reflected twice on reflection surface 161 of reflective member 160 and, subsequently, extracted from at least one side surface of light transmitting member 150 interfacing with encapsulant 170. Although some light may be reflected once on reflection surface 161 and extracted from light transmitting member 150 via the side surface of light transmitting member 150, such light may be incident on the side surface of light transmitting member 150 at an incident angle of about 36°, which is also smaller than the critical angle of 52.8°. As such, this portion of the light may also be redirected toward the outside of LED 100 along with the light that is twice incident upon reflection surface 161.

As also seen in FIG. 2, even light incident at 10°, 20°, 30°, 40° or 50° (or anywhere therebetween) with respect to the normal of incident surface 151 may be reflected on reflection surface 161 so that such light may be totally internally reflected at the interface between light transmitting member 150 and adhesive 130 or the interface between light transmitting member 150 and encapsulant 170. Accordingly, light being incident on the side surface of light transmitting member 150 may be extracted from light transmitting member 150 and, thereby, transmitted to encapsulant 170.

Light extracted from light transmitting member 150 and, thereby, transmitted to encapsulant 170 may be reflected on mounting surface 195 and/or reflection surface 197 of mounting member 190. This reflected light may then pass through an interface between encapsulant 170 and an ambient environment for extraction into the ambient environment.

In the aforementioned illustrative example, the angle θ formed between reflection surface 161 and incident surface 151 may be greater than half the critical angle associated with the respective refractive indices of light transmitting member 150 and adhesive 130, as well as greater than half the critical angle $θ_c$ associated with the respective refractive indices of light transmitting member 150 and encapsulant 170. Accordingly, light radiating from a bottom surface of light emitting component 10 towards light transmitting member 150 may be reflected on reflection surface 161 and, thereby, made incident on incident surface 151 of light transmitting member 150 with an incident angle greater than the critical angle of incident surface 151. In this manner, such light may be totally internally reflected at the interface between light transmitting member 150 and adhesive 130 or the interface between light transmitting member 150 and encapsulant 170. Such a configuration enables all (or substantially all) of the light to be extracted from the side surface of light transmitting member 150 and, thereby, transmitted to encapsulant 170. In the aforementioned illustrative example, light transmitting member 150 is configured with a refractive index greater than the index of refraction associated with adhesive 130, and reflection surface 161 is configured to enable light incident on light transmitting member 150 to have an incident angle greater than the critical angle associated with the respective refractive indices of light transmitting member 150 and adhesive 130, as well as greater than the critical angle associated with the respective refractive indices of light transmitting member 150 and encapsulant 170. This configuration enables even light emitted directly downward from light emitting component 10 to be prevented from being incident on and, thereby, absorbed by light emitting component 10. Instead, such light may be totally internally reflected at the lower surface of the top surface of light transmitting member 150 so that such light may be extracted from the side surface of light transmitting member 150 and, thereby, transmitted to encapsulant 170.

Furthermore, since the top surface (i.e., incident surface 151) of light transmitting member 150 is a flat (or substantially flat) surface, light emitting component 10 may be stably connected to (or otherwise mounted on) light transmitting member 150. In this manner, LED 100 comprises a structure, which not only enables light emitting component 10 to be stably connected to the mounting surface of light transmitting member 150, but also enables light radiating from light emitting component 10 towards light transmitting member 150 to be efficiently extracted from light transmitting member 150 and, thereby, from LED 100 to an ambient environment. While specific reference has been made to the aforementioned configuration, it is contemplated that LED 100 may be additionally and/or alternatively configured, as will become more apparent below.

According to another exemplary embodiment, a reflection surface of a reflective member may be alternatively configured in a convex manner with respect to a light emitting component. In this illustrative embodiment, the reflection surface may be inclined in at least two directions with respect to, for instance, a central portion of a light transmitting member. This exemplary embodiment will be described in more detail in association with FIGS. 3A, 3B, and 4.

Figure 3:
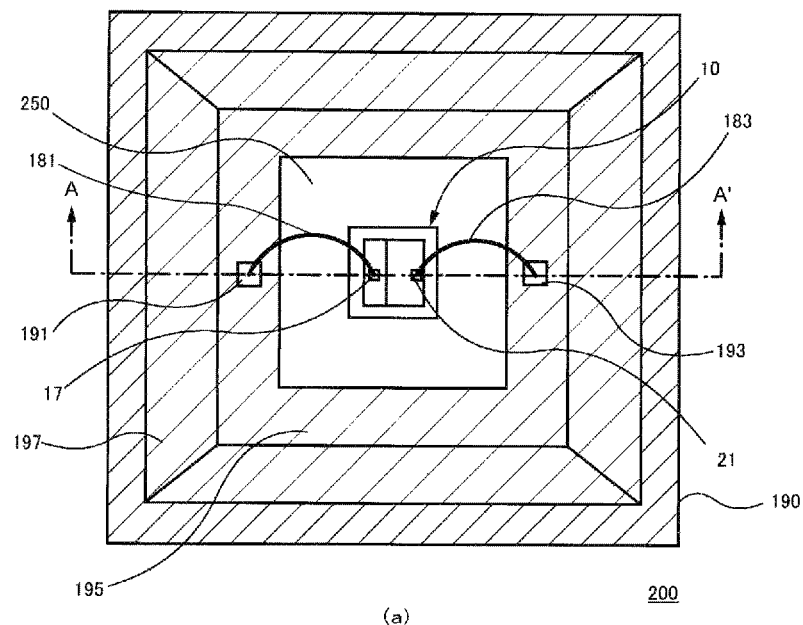
FIG. 3A schematically illustrates a plan view of another LED, according to an exemplary embodiment.
FIG. 3B schematically illustrates a sectional view of the LED of FIG. 3A taken along sectional line A-A', according to an exemplary embodiment.
Figure 3:
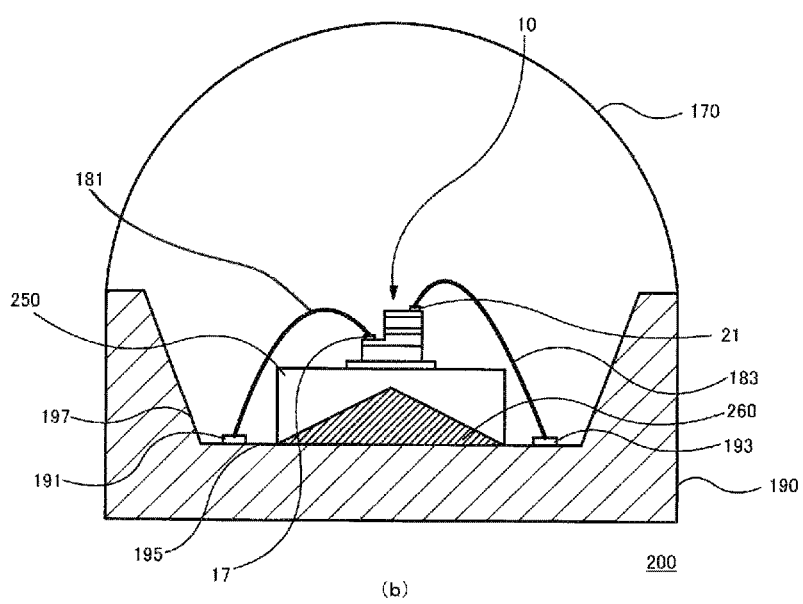
Figure 4:
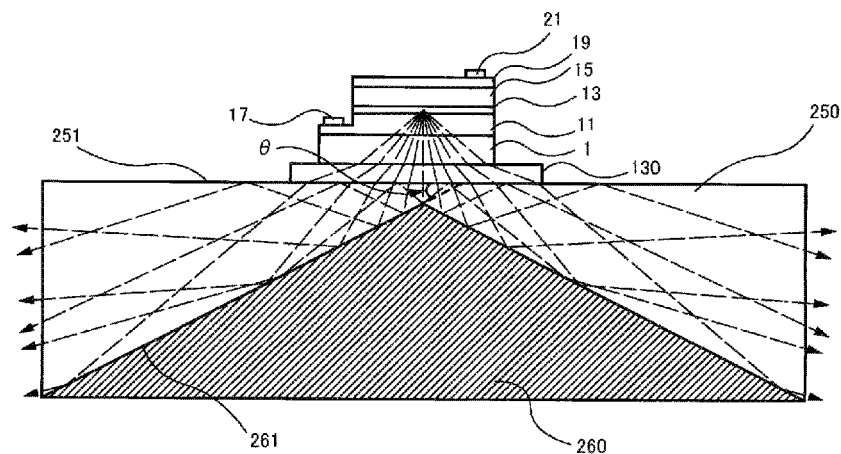
FIG. 4 schematically illustrates light propagation behavior of light radiating from a light emitting component of the LED of FIGS. 3A and 3B, according to an exemplary embodiment.

FIG. 3A schematically illustrates a plan view of another LED, according to an exemplary embodiment. FIG. 3B schematically illustrates a sectional view of the LED of FIG. 3A taken along sectional line A-A'. FIG. 4 schematically illustrates light propagation behaviors of light radiating from a light emitting component of the LED of FIGS. 3A and 3B. As seen in FIGS. 3-4, LED 200 includes light emitting component 10 disposed on a mechanism having light transmitting member 250 and reflective member 260 and is, thereby, configured to efficiently extract light toward an outside of LED 200, as well as minimize absorption of reflected light by light emitting component 10. According to various exemplary embodiments, light transmitting member 250 is disposed on reflective member 260 that is, in turn, disposed on a surface of a concave portion of mounting member 190. Light emitting component 10 may be connected to a top surface of light transmitting member 250 via, for example, adhesive 130. In one embodiment, light emitting component 10 includes first semiconductor layer 11, light emitting layer 13, second semiconductor layer 15, and transparent electrode layer 19, which may be sequentially disposed on a top surface of supporting substrate 1. First electrode layer 17 may be disposed on at least a portion of an exposed region of first semiconductor layer 11. Second electrode layer 21 may be disposed on at least a portion of transparent electrode layer 19. First electrode layer 17 may be electrically connected to third electrode 191 disposed on mounting member 190 via, for instance, bonding wire (or lead) 181. Second electrode layer 21 may be electrically connected to fourth electrode 193 disposed on mounting member 190 via, for example, bonding wire (or lead) 183. According to various exemplary embodiments, encapsulant 170 may encapsulate (or otherwise cover) light emitting component 10, adhesive 130, light transmitting member 250, and reflective member 260. In certain embodiments, encapsulant 170 may further encapsulate at least a portion of mounting member 190, such as a portion including the concave portion of mounting member 190. It is noted that in the exemplary embodiment illustrated in FIGS. 3-4, light emitting component 10, adhesive 130, encapsulant 170, bonding wires 181 and 183, and mounting member 190 may be similarly configured the corresponding components illustrated and described in association with FIGS. 1-2. As such, the description of these corresponding constituent elements will be omitted.

As seen in FIGS. 3B and 4, reflective member 260 includes reflection surface 261 having a convex shape toward light emitting component 10. According to various exemplary embodiments, reflection surface 261 is configured to reflect light of one or more predetermined wavelengths, which are incident on and transmitted through light transmitting member 250. Reflection surface 261 may be inclined with respect to mounting surface 195 of mounting member 190, such that the angle formed between reflection surface 261 and incident surface 251 of light transmitting member 250 is configured to be an acute angle. Angle θ formed between reflection surface 261 and incident surface 251 may be greater than half a first critical angle $\theta_{c1}$ associated with the respective refractive indices of light transmitting member 250 and adhesive 130. Angle θ formed between reflection surface 261 and incident surface 251 may also be greater than half a second critical angle $\theta_{c2}$ associated with the respective refractive indices of light transmitting member 250 and encapsulant 170. As previously mentioned, critical angles $\theta_{c1}$ and $\theta_{C2}$ correspond to angles at which incident light is internally reflected rather than refracted.

In certain embodiments, reflective member 260 may comprise one or more metal films, such as one or more thin-metal films of silver, disposed on reflection surface 261, which serves as an interface between reflective member 260 and light transmitting member 250. Reflective member 260 may be inclined so that light reflected by reflective member 260 and incident on light transmitting member 250 may be totally internally reflected at the interface between light transmitting member 250 and adhesive 130 or the interface between light transmitting member 250 and encapsulant 170. In this manner, such light can be redirected toward and, thereby, extracted at, at least one side surface of light transmitting member 250. As seen in FIG. 4, such light may be extracted at, at least two side surfaces of light transmitting member 250.

According to various exemplary embodiments, reflective member 260 may be convexly shaped so that reflection surface 261 may redirect light for extraction towards at least two side surfaces of light transmitting member 250. In this manner, reflective member 260 may comprise a roof-type shape in which a rectangular surface of a triangular pillar is disposed on mounting surface 195 of mounting member 190. As such, reflective member 260 may be a regular polygonal pyramid, such as a regular triangular pyramid, a regular square pyramid, a regular pentagonal pyramid, a regular hexagonal pyramid, a regular octagonal pyramid, or a circular cone. It is contemplated that the shape of reflective member 260 may be suitably selected so as long as angle θ formed between reflection surface 261 and incident surface 251 is greater than half the critical angle $\theta_c$.

Light transmitting member 250, according to various exemplary embodiments, may comprise one or more materials identical to those utilized in association with light transmitting member 150. The geometric configuration of light transmitting member 250 may be suitably selected to correspond to the geometric configuration of reflective member 260. As previously described in association with light transmitting member 150, a top surface of light transmitting member 250, i.e., a surface upon which light emitting component 10 may be mounted, may be a flat (or substantially flat) surface. Depending on the geometric configuration of reflective member 260, the geometric configuration of the mounting surface of light transmitting member 250 may be selected as, for instance, a regular polygonal pillar, such as a regular triangular pillar, a regular square pillar, a regular pentagonal pillar, a regular hexagonal pillar, a regular octagonal pillar, or a cylinder. In this manner, incident surface 251 of light transmitting member 250 upon which light is incident is a flat (or substantially flat) surface. As such, light emitting component 10 may be stably mounted on incident surface 251.

According to certain exemplary embodiments, the mounting area associated with light emitting component 10 on supporting substrate 1 may be smaller than respective facial surface areas of light transmitting member 250 and reflective member 260. In this manner, light emitting component 10 may be centrally disposed on the mounting surface of light transmitting member 250 so that light radiating from light emitting component 10 towards reflective member 260 may be extracted at, at least two side surfaces of light transmitting member 250. It is contemplated, however, that any suitable mounting position may be utilized.

It is noted that the light propagation behaviors associated with LED 200 are similar, but not identical to the light propagation behaviors of LED 100. Namely, due to the previously described convex configuration of reflective member 260, light is emitted (or otherwise extracted) from, for instance, at least two opposite side surfaces of light transmitting member 250 and, thereby, transmitted to encapsulant 170 when reflective member 260 comprises a roof-type shape. It is noted, however, that light may be emitted from each of the side surfaces of light transmitting member 250 when reflective member 260 is alternatively configured as, for instance, a regular polygonal pyramid, such as a regular triangular pyramid, a regular square pyramid, a regular pentagonal pyramid, a regular hexagonal pyramid, or a regular octagonal pyramid. Further, light may be emitted from all side surfaces of light transmitting member 250 when reflective member 260 is configured as a circular cone.

Accordingly, light transmitted through light transmitting member 250 may be reflected on reflection surface 261 and, thereby, redirected towards the lower surface of the top surface of light transmitting member 250. In turn, such redirected light may be totally internally reflected at the interface between light transmitting member 250 and adhesive 130 or the interface between light transmitting member 250 and encapsulant 170. As such, light propagating towards at least one of the side surfaces of light transmitting member 250 may be extracted and, thereby, transmitted to encapsulant 170. The facial surface areas of light transmitting member 250 and reflective member 260 may, therefore, be greater than the mounting area of light emitting component 10 disposed on supporting substrate 1. This enables light to be efficiently extracted through the side surface(s) of light transmitting member 250. It is noted that light emitting component 10 may be theoretically considered as a point light source with respect to light transmitting member 250 and reflective member 260. Thus, the mounting area of light emitting component 10 on supporting substrate 1 may be smaller than the respective facial surface areas of light transmitting member 250 and reflective member 260, and as small as reasonably feasible so long as LED 200 can be fabricated. It is further contemplated that the respective heights and lengths of light transmitting member 250 and reflective member 260 may be proportional to the angle θ formed between reflection surface 261 and incident surface 251.

In various exemplary embodiments, the angle θ formed between reflection surface 261 and incident surface 251 may be greater than half the critical angle associated with the respective refractive indices of light transmitting member 250 and adhesive 130, as well as greater than half the critical angle $θ_c$ associated with the respective refractive indices of light transmitting member 250 and encapsulant 170. Further, reflective member 260 may be convexly configured toward light emitting component 10. As such, light radiating from a bottom surface of light emitting component 10 toward light transmitting member 250 may be reflected at reflection surface 261 and, thereby, redirected towards incident surface 251 of light transmitting member 250. Such light may be incident on reflection surface 251 having an incident angle greater than the critical angle associated with incident surface 251. Thus, such incident light may be totally internally reflected at the interface between light transmitting member 250 and adhesive 130 or the interface between light transmitting member 250 and encapsulant 170. This further enables all (or substantially all) of the light to be extracted from one or more side surfaces of light transmitting member 250. In various exemplary embodiments, light transmitting member 250 is associated with a refractive index greater than the index of refraction associated with adhesive 130, and reflection surface 261 may be formed so that light incident on light transmitting member 250 has an incident angle greater than the critical angle $θ_c$ associated with the respective refractive indices of light transmitting member 250 and adhesive 130, as well as greater than half the critical angle $θ_c$ associated with the respective refractive indices of light transmitting member 250 and encapsulant 170. Thus, even light emitted directly downward from light emitting component 10 is prevented from be re-incident on and, thereby, absorbed by light emitting component 10. Instead, such light is totally internally reflected at incident surface 251 so that such light may be extracted from the side surface(s) of light transmitting member 250 and, thereby, transmitted to encapsulant 170. In this manner, since light can be emitted from the side surface(s) of light transmitting member 250 in a plurality of directions, it is possible to improve the efficiency and uniformity of light emitted from LED 200.

Furthermore, since the top surface (i.e., incident surface 251 and, thereby, mounting surface) of light transmitting member 250 is a flat (or substantially flat) surface, light emitting component 10 may be stably connected to (or otherwise mounted on) light transmitting member 250. In this manner, LED 200 comprises a structure, which not only enables light emitting component 10 to be stably connected to the mounting surface of light transmitting member 250, but also enables light radiating from light emitting component 10 towards light transmitting member 250 to be efficiently extracted from light transmitting member 250 and, thereby, from LED 200 to an ambient environment.

In the aforementioned exemplary embodiments, the mounting area associated with light emitting component 10 on supporting substrate 1 in each of the illustrative LEDs has been configured with a smaller footprint than the corresponding facial surface areas of the respective light transmitting members and reflective members. Such configurations enable light radiating from light emitting component 10 towards the corresponding light transmitting members to be extracted from one or more side surfaces of the respective light transmitting members associated with the various illustrative LEDs. It is contemplated, however, that the mounting area associated with light emitting component 10 on supporting substrate 1 may be alternatively sized. For instance, the mounting area may be sized proportionally to the corresponding facial surface of area of a respective light transmitting member on which light emitting component 10 and supporting substrate 1 are disposed. Such an illustrative example will be described in more detail in association with FIG. 5.

Figure 5:
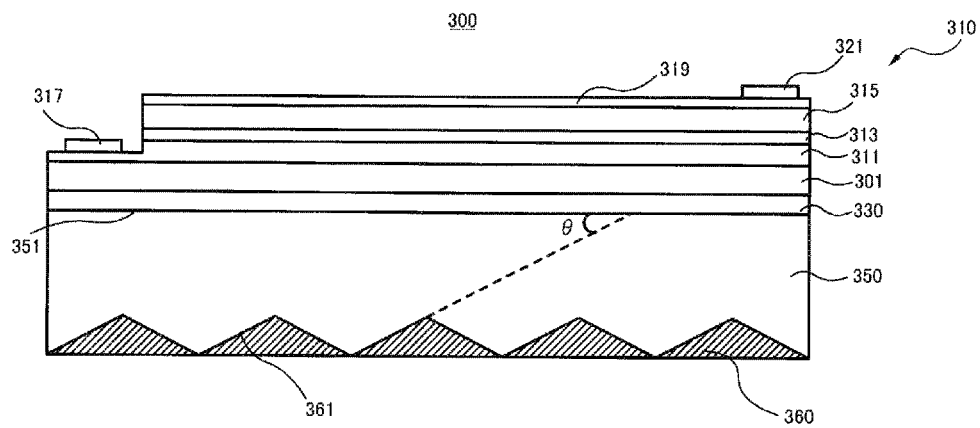
FIG. 5 schematically illustrates a sectional view of yet another LED, according to an exemplary embodiment.

FIG. 5 schematically illustrates a sectional view of yet another LED, according to an exemplary embodiment. As shown, LED 300 includes light emitting component 310 disposed on a top surface of a mechanism having light transmitting member 350 and reflective member 360 and is, thereby, configured to efficiently extract light toward an outside of LED 300, as well as minimize the absorption of reflected light by light emitting component 310. In this manner, light emitting component 10 may be disposed on (e.g., connected to) the top surface of light transmitting member 350 via, for example, adhesive 330. According to various exemplary embodiments, light emitting component 310 includes first semiconductor layer 311, light emitting layer 313, second semiconductor layer 315, and transparent electrode layer 319, which may be sequentially disposed on a top surface of supporting substrate 301. First electrode layer 317 may be disposed on at least a portion of an exposed portion of first semiconductor layer 311. Second electrode layer 321 may be disposed on at least a portion of transparent electrode layer 319.

While not illustrated, reflective member 360, which is covered by light transmitting member 350 having light emitting component 310 disposed thereon, may be disposed on a surface of a concave portion of a corresponding mounting member, such as mounting member 190 of FIGS. 1A, 1B, 3A, and 3B. In this manner, first electrode layer 317 may be electrically connected to third electrode 191 disposed on mounting member 190 via, for instance, bonding wire (or lead) 181. Second electrode layer 321 may be electrically connected to fourth electrode 193 disposed on mounting member 190 via, for instance, bonding wire (or lead) 183. According to various exemplary embodiments, an encapsulant (not shown), such as encapsulant 170, may encapsulate (or otherwise cover) light emitting component 310, light transmitting member 350, and reflective member 360. In certain embodiments, the encapsulant may further encapsulate at least a portion of the mounting member, such as a portion including the concave portion of mounting member 190. It is noted that in the exemplary embodiment illustrated in FIG. 5, the encapsulant, bonding wires 181 and 183, and mounting member 190 may be similarly configured as the corresponding components illustrated and described in association with FIGS. 1-4. As such, the description of these corresponding constituent elements will be omitted.

As shown, reflective member 360 may include a plurality of reflection surfaces 361, each reflection surface being convexly configured (or otherwise shaped) toward light emitting component 310. In this manner, each of reflection surfaces 361 may be further configured to reflect light of one or more predetermined wavelengths transmitted through light transmitting member 350. According to one exemplary embodiment, reflection surface 361 may be inclined with respect to a mounting surface of a mounting member 190, such as mounting surface 195 of mounting member 190 of FIGS. 1A, 1B, 3A, and 3B. In this manner, a respective angle θ formed between each of the plurality of reflection surfaces 361 (having respective convex shapes) and incident surface 351 of light transmitting member 350 may be an acute angle(s). Respective angles θ formed between reflection surface(s) 361 and incident surface 351 may be greater than half a critical angle $\theta_c$ associated with the respective refractive indices of light transmitting member 350 and adhesive 330. In certain exemplary embodiments, reflective member 360 may comprise one or more metal films, such as one or more thin-metal films of silver, disposed on reflection surfaces 361, which respectively serve as corresponding interfaces between reflective member 360 and light transmitting member 350. Reflective member 360 may be inclined so that light reflected by reflective member 360 and incident on light transmitting member 350 may be totally internally reflected at the interface between light transmitting member 350 and adhesive 330. In this manner, such light can be redirected toward and, thereby, extracted at, at least one side surface of light transmitting member 350. As seen in FIG. 5, such light may be extracted at, at least two side surfaces of light transmitting member 350.

According to various exemplary embodiments, reflective member 360 includes a plurality of convexly shaped structures having corresponding reflection surfaces 361 configured to redirect light for extraction towards at least two side surfaces of light transmitting member 350. In this manner, reflective member 360 may include a plurality of roof-type structures in which a rectangular surface of a triangular pillar forming each roof-type structure is disposed on the mounting surface of the mounting member, such as mounting surface 195 of mounting member 190. As such, reflective member 360 may comprise a plurality of structures, each structure defining a regular polygonal pyramid, such as a regular triangular pyramid, a regular square pyramid, a regular pentagonal pyramid, a regular hexagonal pyramid, a regular octagonal pyramid, or a circular cone. It is contemplated that the overall geometric configuration (or shape) of reflective member 360 may be suitably selected so long as the corresponding angles $\theta$ formed between respective reflection surfaces 361 and incident surface 351 is greater than half the critical angle $\theta_c$.

Accordingly, any suitable number of facets comprising reflective member 360 may be provided. It is noted that the facet(s) also define corresponding reflection surfaces 361. In this manner, the number of facets utilized may be optimized so that light incident on reflective member 360 may be redirected towards incident surface 351 and/or towards at least one side surface of light transmitting member 350 for extraction. In this manner, the number may be further optimized to maximize the amount of light extracted from corresponding side surfaces of light transmitting member 350. As such, it is possible to implement an LED having high light extraction efficiency and low thermal resistance.

Light transmitting member 350, according to various exemplary embodiments, may comprise one or more materials similar to those utilized in association with light transmitting member 150. The geometric configuration of light transmitting member 350 may be suitably selected to correspond to the geometric configuration of reflective member 360. As previously described in association with light transmitting member 150, a top surface of light transmitting member 350, i.e., a surface upon which light emitting component 310 may be disposed (or otherwise connected to), may be a flat (or substantially flat) surface. Depending on the geometric configuration of reflective member 360, the geometric configuration of the mounting surface of light transmitting member 350 may be selected as, for instance, a regular polygonal pillar, such as a regular triangular pillar, a regular square pillar, a regular pentagonal pillar, a regular hexagonal pillar, a regular octagonal pillar, or a cylinder. According to one exemplary embodiment, the geometric configuration of the mounting surface of light transmitting member 350 is a regular square pillar or a cylinder depending on the corresponding design of light emitting component 310. In this manner, incident surface 351 of light transmitting member 350 upon which light is incident is a flat (or substantially flat) surface. As such, light emitting component 310 may be stably mounted on incident surface 351.

Accordingly to various exemplary embodiments, light emitting component 310 is substantially similar to light emitting component 10; however, light emitting component 310 disposed on supporting substrate 301 may be geometrically configured in association with (or otherwise to correspond to) the respective facial surfaces of light transmitting member 350 and reflective member 360. Namely, light emitting component 310 may be configured to cover all (or substantially all) of the facial surface of light transmitting member 350. As such, the remaining description of light emitting component 310 will be omitted. It is further noted that adhesive 330 may correspond to adhesive 130 except that the geometric configuration of adhesive 330 may also be geometrically configured in association with (or to correspond to) the respective facial surfaces of light transmitting member 350 and reflective member 350. That is, adhesive 330 may likewise be configured to cover all (or substantially all) of the facial surface of light transmitting member 350. As such, the remaining description of adhesive 330 will be omitted. Accordingly, since the areas of light transmitting member 350 and reflective member 360 are decreased in accordance with the mounting area of light emitting component 310 disposed on supporting substrate 301, light extracted from light transmitting member 350, as will be described later, may be extracted from two or more (e.g., all) the side surfaces of light transmitting member 350.

It is noted that the light propagation behaviors associated with LED 300 may be similar, but not identical to the light propagation behaviors of LED 200. Namely, due to the previously described plurality of convexly shaped reflection surfaces 361, light radiating from light emitting component 310 may propagate through adhesive 330 and light transmitting member 350 to be reflected at reflective member 360, redirected towards incident surface 351, totally internally reflected at incident surface 351, i.e., at the interface between light transmitting member 350 and adhesive 330, and redirected towards and, thereby, reflected by reflective member 360. In this manner, light may be emitted (or otherwise extracted) from one or more side surfaces of light transmission member 350 toward, for example, encapsulant 170 and/or mounting member 190 by repeating total internal reflection at the interface between light transmitting member 350 and adhesive 330 and repeating reflection at reflective member 360.

Accordingly, since LED 300 may be provided with reflective member 360 having the plurality of reflection surfaces 361, each reflection surface 361 including a convex shape toward light emitting component 310, and since the mounting area of light emitting component 310 on supporting substrate 301 may be configured to correspond to (e.g., be substantially identical to) the facial surface areas of light transmitting member 350 and reflective member 360, and further since the respective heights of light transmitting member 350 and reflective member 360 may be smaller than the corresponding heights of the light transmitting members and the reflective members of LEDs 100 and 200, the distance between light emitting component 310 and mounting surface 195 of mounting member 190 may be shortened. As such, the thermal resistance between light emitting component 310 and mounting member 190 can be decreased. Accordingly, it is possible to provide an LED configured to enable heat emitted from light emitting component 310 to be more easily dissipated from mounting member 190.

The angle θ formed between reflection surface 361 and incident surface 351 may be greater than half the critical angle $θ_c$ associated with the respective refractive indices of light transmitting member 350 and adhesive 330. Further, reflective member 360 includes the plurality of reflection surfaces 361, each reflection surface 361 being convexly shaped toward light emitting component 310. Accordingly, light radiating from a bottom surface of light emitting component 310 may be transmitted through light transmitting member 350, reflected on reflection surface 361 of reflective member 360, redirected towards incident surface 351 of light transmitting member 350, totally internally reflected at incident surface 351, i.e., at the interface between light transmitting member 350 and adhesive 330, and, thereby, redirected towards reflective member 360. At some subsequent point in time, all (or substantially all) of the light may be extracted from at least one side surface of light transmitting member 350 and, thereby, transmitted to encapsulant 170 via one or more repeat total internal reflections at the interface between light transmitting member 350 and adhesive 330 and/or repeat reflections from reflective member 360. Further, light transmitting member 350 may be associated with a refractive index greater than the index of refraction associated with adhesive 330, and the plurality of reflection surfaces 361, each being convexly shaped, may be formed so that light incident on light transmitting member 350 may have an incident angle greater than the critical angle $θ_c$ associated with the respective refractive indices of light transmitting member 350 and adhesive 330. Accordingly, even light emitted directly downward from light emitting component 310 can be prevented from being re-incident on and, thereby, absorbed by light emitting component 310. Instead, such light may be totally internally reflected, and subsequently extracted from at least one side surface of light transmitting member 350 and, thereby, transmitted to encapsulant 170. Since such light is extracted from the at least one side surface of light transmitting member 350 in a plurality of directions, it is possible to improve the uniformity of light emitted from LED 300.

Furthermore, since the top surface (i.e., incident surface 351 and, thereby, mounting surface) of light transmitting member 350 is a flat (or substantially flat) surface, light emitting component 10 may be stably connected to (or otherwise disposed on) light transmitting member 350. In this manner, LED 300 comprises a structure, which not only enables light emitting component 310 to be stably connected to the mounting surface of light transmitting member 350, but also enables light radiating from light emitting component 310 towards light transmitting member 350 to be efficiently extracted from light transmitting member 350 and, thereby, from LED 300 to an ambient environment. Moreover, since reflective member 360 includes the plurality of reflection surfaces 361, each reflection surface 361 comprising a convex shape toward light emitting component 310, the height of reflective member 360 may be less than the corresponding height associated with reflective member 160. Thus, it is possible to provide an LED comprising a relatively short distance between light emitting component 310 and mounting surface 195 of mounting member 190 and, thereby, enabling an LED having low thermal resistance.

According to another exemplary embodiment, an LED may comprise a plurality of reflection surfaces, each reflection surface having a convex shape, wherein the plurality of reflect surfaces are disposed so that a reflective member including the plurality of reflection surfaces has an overall convex shape toward a light emitting component of the LED. Such an exemplary embodiment is described in more detail in association with FIG. 6.

Figure 6:
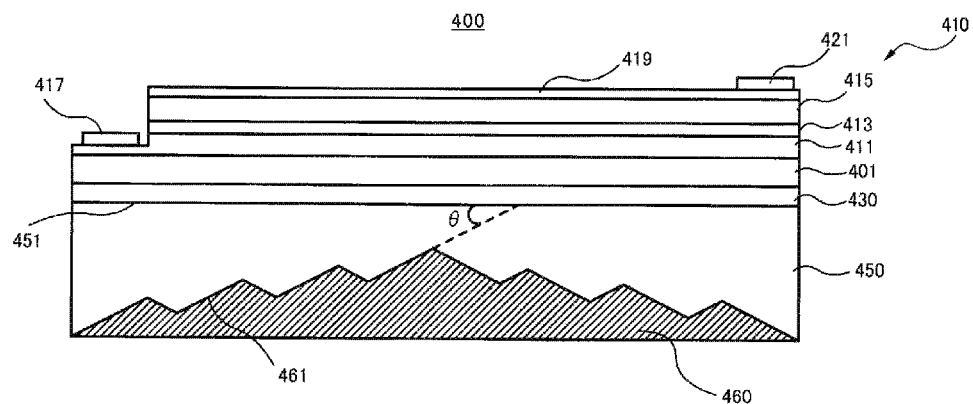
FIG. 6 schematically illustrates a sectional view of a further LED, according to an exemplary embodiment.

FIG. 6 schematically illustrates a sectional view of a further LED, according to an exemplary embodiment. As illustrated, LED 400 includes light emitting component 410 disposed on a top surface of a mechanism having light transmitting member 450 and reflective member 460 and is, thereby, configured to efficiently extract light toward an outside of LED 400, as well as minimize the absorption of reflected light by light emitting component 410. In this manner, light emitting component 410 may be disposed on (e.g., connected to) the top surface of light transmitting member 450 via, for example, adhesive 430. According to various exemplary embodiments, light emitting component 410 includes first semiconductor layer 411, light emitting layer 413, second semiconductor layer 415, and transparent electrode layer 419, which may be sequentially disposed on a top surface of supporting substrate 401. First electrode layer 417 may be disposed on at least a portion of an exposed portion of first semiconductor layer 411. Second electrode layer 421 may be disposed on at least a portion of transparent electrode layer 419.

While not illustrated, reflective member 460, which is covered by light transmitting member 450 having light emitting component 410 disposed thereon, may be disposed on a surface of a concave portion of a mounting member, such as mounting member 190 of FIGS. 1A, 1B, 3A, and 3B. In this manner, first electrode layer 417 may be electrically connected to third electrode 191 disposed on mounting member 190 via, for instance, bonding wire (or lead) 181. Second electrode layer 421 may be electrically connected to fourth electrode 193 disposed on mounting member 190 via, for example, bonding wire (or lead) 183. According to various exemplary embodiments, an encapsulant (not shown), such as encapsulant 170, may encapsulate (or otherwise cover) light emitting component 410, light transmitting member 450, and reflective member 360. In certain embodiments, the encapsulant may further encapsulate at least a portion of the mounting member, such as a portion including the concave portion of mounting member 190. It is noted that in the exemplary embodiment illustrated in FIG. 6, the encapsulant, bonding wires 181 and 183, and mounting member 190 may be similarly configured as the corresponding components illustrated and described in association with FIGS. 1-4. As such, the description of these corresponding constituent elements will be omitted.

As shown, reflective member 460 may include a plurality of reflection surfaces 461, each reflection surface 461 being convexly configured (or otherwise shaped) toward light emitting component 410. In this manner, each of reflection surfaces 461 may be further configured to reflect light of one or more predetermined wavelengths transmitted through light transmitting member 450. It is also noted that the overall geometric configuration (or structure) of reflective member 460 may be convexly configured (or otherwise shaped) toward light emitting component 410. In this manner, a respective angle θ formed between each of the plurality of reflection surfaces 461 (having respective convex shapes) and incident surface 451 of light transmitting member 450 may be an acute angle(s). Respective angles θ formed between reflection surface(s) 461 and incident surface 451 may be greater than half a critical angle $θ_c$ associated with the respective refractive indices of light transmitting member 450 and adhesive 430. In certain exemplary embodiments, reflective member 460 comprise one or more metal films, such as one or more thin-metal films of silver, disposed on reflection surfaces 461, which respectively serve as corresponding interfaces between reflective member 460 and light transmitting member 450. Reflective member 460 may be inclined so that light reflected by reflective member 460 and incident on light transmitting member 450 may be totally internally reflected at the interface between light transmitting member 450 and adhesive 430. In this manner, such light can be redirected toward and, thereby, extracted at, at least one side surface of light transmitting member 450. As seen in FIG. 6, such light may be extracted at, at least two sides surfaces of light transmitting member 450.

According to various exemplary embodiments, reflective member 460 includes a plurality of convexly shaped structures having reflection surfaces 461 configured to redirect light for extraction towards at least two sides surfaces of light transmitting member 450. In this manner, reflective member 460 may comprise a plurality of roof-type structures in which a rectangular surface of a triangular pillar forming each roof-type structure is disposed on the mounting surface of the mounting member, such as mounting surface 195 of mounting member 190. As such, reflective member 460 may comprise a plurality of structures, each structure defining a regular polygonal pyramid, such as a regular triangular pyramid, a regular square pyramid, a regular pentagonal pyramid, a regular hexagonal pyramid, a regular octagonal pyramid, or a circular cone. It is contemplated that the overall geometric configuration (or shape) of reflective member 460 may be suitably selected so long as the corresponding angles $\theta$ formed between respective reflection surfaces 461 and incident surface 451 is greater than half the critical angle $\theta_c$.

Accordingly, any suitable number of facets comprising reflective member 460 may be provided. It is noted that the facet(s) also define corresponding reflection surfaces 461. In this manner, the number of facets utilized may be optimized so that light incident on reflective member 460 may be redirected towards incident surface 451 and/or towards at least one side surface of light transmitting member 450 for extraction. The number of facets may be further optimized to maximize the amount of light extracted from corresponding side surfaces of light transmitting member 450. As such, it is possible to implement an LED having high light extraction efficiency and low thermal resistance.

Light transmitting member 450, according to various exemplary embodiments, may comprise one or more materials similar to those utilized in association with light transmitting member 150. The geometric configuration of light transmitting member 450 may be suitably selected to correspond to the geometric configuration of reflective member 460. As previously described in association with light transmitting member 150, a top surface of light transmitting member 450, i.e., a surface upon which light emitting component 410 may be disposed (or otherwise connected to), may be a flat (or substantially flat) surface. Depending on the geometric configuration of reflective member 460, the geometric configuration of the mounting surface of light transmitting member 450 may be selected as, for instance, a regular polygonal pillar, such as a regular triangular pillar, a regular square pillar, a regular pentagonal pillar, a regular hexagonal pillar, a regular octagonal pillar, or a cylinder. According to one exemplary embodiment, the geometric configuration of the mounting surface of light transmitting member 450 is a regular square pillar or a cylinder depending on the corresponding design of light emitting component 410. In this manner, incident surface 451 of light transmitting member 450 upon which light is incident is a flat (or substantially flat) surface. As such, light emitting component 410 may be stably mounted on incident surface 451.

According to various exemplary embodiments, light emitting component 410 is substantially similar to light emitting component 10; however, light emitting component 410 disposed on supporting substrate 401 may be geometrically configured in association with (or otherwise to corresponding to) the respective facial surfaces of light transmitting member 450 and reflective member 460. Namely, light emitting component 410 may be configured to cover all (or substantially all) of the facial surface of light transmitting member 450. As such, the remaining description of light emitting component 410 will be omitted. It is further noted that adhesive 430 may correspond to adhesive 130 except that the geometric configuration of adhesive 430 may also be geometrically configured in association with (or to correspond to) the respective facial surfaces of light transmitting member 450 and reflective member 460. That is, adhesive 430 may likewise be configured to cover all (or substantially all) of the facial surface of light transmitting member 450. As such, the remaining description of adhesive 430 will be omitted. Accordingly, since the areas of light transmitting member 450 and reflective member 460 are decreased in accordance with the mounting area of light emitting component 410 disposed on supporting substrate 401, light extracted from light transmitting member 450, as will be described later, may be extracted from two or more (e.g., all) the side surfaces of light transmitting member 450.

It is noted that the light propagation behavior associated with LED 400 may be similar, but not identical to the light propagation behavior of LED 200. Namely, due to the previously described plurality of convexly shaped reflection surfaces 461, which together define a convexly shaped reflective member 460, light radiating from light emitting component 410 may propagate through adhesive 430 and light transmitting member 450 to be reflected at reflective member 460, redirected towards incident surface 451, totally internally reflected at incident surface 451, i.e., at the interface between light transmitting member 450 and adhesive 430, and redirected towards and, thereby, reflected by reflective member 460. In this manner, light may be subsequently emitted (or otherwise extracted) from one or more side surfaces of light transmitting member 450 by repeating total internal reflection at the interface between light transmitting member 450 and adhesive 430 and repeating reflection at reflective member 460.

Accordingly, since LED 400 may be provided with a plurality of reflection surfaces 461, each reflection surface 461 being convexly shaped, such that reflective member 460 include an overall geometric configuration (or structure) being convexly shaped toward light emitting component 410. As such, the mounting area of light emitting component 410 on supporting substrate 401 may be configured to correspond to (e.g., be substantially identical to) the facial surface areas of light transmitting member 450 and reflective member 460. Moreover, the respective heights of light transmitting member 450 and reflective member 460 may be smaller than the corresponding heights of the light transmitting members and the reflective members of LEDs 100 and 200. Thus, the distance between light emitting component 410 and mounting surface 195 of mounting member 190 may be shortened. As such, the thermal resistance between light transmitting member 450 and mounting member 190 can be decreased. Accordingly, it is possible to provide an LED configured to enable heat emitted from light emitting component 410 to be more easily dissipated from mounting member 190.

The angle $\theta$ formed between reflection surface 461 and incident surface 451 may be greater than half the critical angle $\theta_c$ associated with the respective refractive indices of light transmitting member 450 and adhesive 430. Further, reflective member 460 includes the plurality of reflection surfaces 461, each reflection surface 461 being convexly shaped toward light emitting component 410. Accordingly, light radiating from a bottom surface of light emitting component 410 may be transmitted through light transmitting member 450, reflected on one or more of reflection surfaces 461 of reflective member 460, redirected towards incident surface 451 of light transmitting member 450, totally internally reflected at incident surface 451, i.e., at the interface between light transmitting member 450 and adhesive 430, and, thereby, redirected towards reflective member 460. At some subsequent point in time, all (or substantially all) of the light may be extracted from at least one side surface of light transmitting member 450 and, thereby, transmitted to encapsulant 170 via one or more repeat total internal reflections at the interface between light transmitting member 450 and adhesive 430 and/or repeat reflections from reflective member 460. Further, light transmitting member 450 may be associated with a refractive index greater than the index of refraction associated with adhesive 430, and the plurality of reflection surfaces 461, each being convexly shaped, may be formed so that light incident on light transmitting member 450 may have an incident angle greater than the critical angle $\theta_c$ associated with the respective refractive indices of light transmitting member 450 and adhesive 430. Accordingly, even light emitted directly downward from light emitting component 410 can be prevented from being re-incident on and, thereby, absorbed by light emitting component 410. Instead, such light may be totally internally reflected, and subsequently extracted from at least one side surface of light transmitting member 450 and, thereby, transmitted to encapsulant 170. Since such light is extracted from at least one side surface of light transmitting member 450 in a plurality of directions, it is possible to improve the uniformity of light emitted from LED 400.

Furthermore, since the top surface (i.e., incident surface 451 and, thereby, mounting surface) of light transmitting member 450 is a flat (or substantially flat) surface, light emitting component 410 may be stably connected to (or otherwise disposed on) light transmitting member 450. In this manner, LED 400 comprises a structure, which not only enables light emitting component 410 to be stably connected to the mounting surface of light transmitting member 450, but also enables light radiating from light emitting component 410 towards light transmitting member 450 to be efficiently extracted from light transmitting member 450 and, thereby, from LED 400 to an ambient environment. Moreover, since reflective member 460 includes the plurality of reflection surfaces 461, each reflection surface 461 comprising a convex shape toward light emitting component 410, the height of reflective member 460 may be less than the corresponding height associated with reflective member 160. Thus, it is possible to provide an LED comprising a relatively short distance between light emitting component 410 and mounting surface 195 of mounting member 190 and, thereby, enabling an LED having low thermal resistance.

According to various exemplary embodiments, it is possible to provide an LED comprising one or more structures, mechanisms, and/or constituent elements configured to efficiently extract light emitted from a light emitting component toward a light transmitting member and, thereby, toward an ambient environment of the LED. It is also possible to provide an LED comprising one or more structures, mechanisms, and/or constituent elements for stably mounting a light emitting component and efficiently extracting light emitted from the light emitting component and being transmitted to a light transmitting element and, thereby, being extracted toward an ambient environment of the LED. Furthermore, it is possible to provide an LED exhibiting a relatively short distance between a light emitting component and a mounting surface of a mounting member upon which the light emitting component is mounted and, thereby, provide an LED further exhibiting low thermal resistance.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A light emitting diode (LED) comprising:
   a reflective member;
   a light transmitting member disposed on the reflective member; and
   a light emitting component disposed on the light transmitting member;
   wherein the light transmitting member is configured to pass, at a first surface, light propagating from the light emitting component toward the reflective member, and further configured to, at the first surface, totally internally reflect the light reflected from the reflective member.

2. A light emitting diode (LED) comprising:
   a reflective member;
   a light transmitting member disposed on the reflective member;
   a light emitting component disposed on the light transmitting member; and
   an intermediate layer disposed between the light emitting component and the light transmitting member,
   wherein the light transmitting member is configured to pass, at a first surface, light propagating from the light emitting component toward the reflective member, and further configured to, at the first surface, totally internally reflect the light reflected from the reflective member, and the intermediate layer is configured in association with the light transmitting member to cause the light reflected from the reflective member to be totally internally reflected at the first surface.

3. The LED of claim 2, wherein an index of refraction associated with the light transmitting member is greater than an index of refraction associated with the intermediate layer.

4. The LED of claim 2, wherein the intermediate layer is an adhesive.

5. The LED of claim 2, wherein the reflective member comprises at least one reflection surface configured to form at least one acute angle with the first surface of the light transmitting member.

6. The LED of claim 5, further comprising:
   an intermediate layer disposed between the light emitting component and the light transmitting member,
   wherein the at least one acute angle is greater than half a critical angle associated with respective indices of refraction associated with the light transmitting member and the intermediate layer.

7. The LED of claim 5, wherein the reflective member comprises a plurality of reflection surfaces including the at least one reflection surface, each of the plurality of reflection surfaces being configured to respectively form the acute angle at least one other acute angle with the first surface of the light transmitting member.

8. The LED of claim 7, wherein the plurality of reflection surfaces are contiguous.

9. The LED of claim 2, wherein the reflective member comprises at least one convex configuration configured to interface with the light transmitting member.

10. The LED of claim 2, wherein the light emitting component and the light transmitting member are encapsulated by an encapsulant, and wherein an index of refraction associated with the encapsulant is less than an index of refraction associated with the light transmitting member.

11. The LED of claim 1, wherein the light totally internally reflected at the first surface is subsequently emitted from the light transmitting member at, at least one second surface of the light transmitting member.

12. The LED of claim 1, wherein the first surface is substantially flat.

13. The LED of claim 1, wherein a footprint associated with the light emitting component is less than or substantially equal to a facial surface area of the light transmitting member.

14. The LED of claim 2, wherein the light emitting component is disposed offset from a central location of the first surface.

15. The LED of claim 1, wherein the light emitting component is substantially centrally disposed on the first surface.

16. A light emitting diode (LED), comprising:
 a light emitting component comprising a light emitting layer disposed on a substrate, wherein the light emitting layer is configured to emit light of at least one wavelength, and wherein the substrate is configured to transmit the light therethrough;
 an adhesive configured to transmit the light therethrough;
 a light transmitting member configured to transmit the light therethrough; and
 a reflective member comprising at least one reflection surface configured to reflect the light, wherein the at least one reflection surface is further configured to form an acute angle with an incident surface associated with the light transmitting member,
 wherein the light emitting component is connected to the light transmitting member via the adhesive, and an index of refraction associated with the light transmitting member is greater than an index of refraction associated with the adhesive.

17. The LED of claim 16, wherein the acute angle formed between the at least one reflection surface and the incident surface is greater than half a critical angle associated with the respective indices of refraction associated with the light transmitting member and the adhesive.

18. The LED of claim 17, wherein the light emitting component and the light transmitting member are covered by an encapsulant and wherein an index of refraction associated with the encapsulant is less than the index of refraction associated with the light transmitting member.

19. The LED of claim 18, wherein the light emitted from the light emitting layer is emitted from at least one side surface of the light transmitting member toward the encapsulant.

20. The LED of claim 19, wherein the at least one side surface of the light transmitting member is configured to form an angle with the light emitted toward the encapsulant so that the light is not totally internally reflected.

* * * * *